(12) United States Patent
Wang et al.

(10) Patent No.: US 12,093,549 B2
(45) Date of Patent: Sep. 17, 2024

(54) METHOD FOR MANAGING DATA AND STORAGE DEVICE THEREOF

(71) Applicant: RayMX Microelectronics, Corp., Hefei (CN)

(72) Inventors: Hui Wang, Hefei (CN); Chun Yan Tang, Hefei (CN); Lin Su, Hefei (CN)

(73) Assignee: RayMX Microelectronics, Corp., Hefei (CN)

(*) Notice: Subject to any disclaimer, the term of this patent is extended or adjusted under 35 U.S.C. 154(b) by 28 days.

(21) Appl. No.: 17/938,707

(22) Filed: Oct. 7, 2022

(65) Prior Publication Data
US 2023/0205441 A1 Jun. 29, 2023

(30) Foreign Application Priority Data
Dec. 23, 2021 (CN) .......................... 202111587443.1

(51) Int. Cl.
*G06F 3/06* (2006.01)
*G06F 12/02* (2006.01)

(52) U.S. Cl.
CPC .......... *G06F 3/064* (2013.01); *G06F 12/0253* (2013.01); *G06F 3/0604* (2013.01); *G06F 3/0679* (2013.01)

(58) Field of Classification Search
USPC ............................. 711/103, E12.008, 154, 16
See application file for complete search history.

(56) References Cited

U.S. PATENT DOCUMENTS

| 10,388,387 | B2 | 8/2019 | Park |
| 10,733,110 | B1 | 8/2020 | Volpe |
| 11,210,168 | B1* | 12/2021 | Lam ..................... G06F 12/0246 |
| 11,269,542 | B2 | 3/2022 | Byun |
| 2013/0159815 | A1* | 6/2013 | Jung ....................... G06F 12/00 714/763 |
| 2013/0198453 | A1* | 8/2013 | Kim ..................... G06F 12/0871 711/E12.017 |
| 2015/0193302 | A1* | 7/2015 | Hyun ................... G11C 29/028 714/764 |
| 2017/0242722 | A1* | 8/2017 | Qiu ........................ G06F 3/0655 |
| 2020/0034080 | A1* | 1/2020 | Chen ..................... G11C 29/76 |
| 2020/0210295 | A1 | 7/2020 | Lee et al. |

(Continued)

FOREIGN PATENT DOCUMENTS

| CN | 111367468 A | 7/2020 |
| CN | 112558860 A | 3/2021 |
| TW | 201911057 A | 3/2019 |

*Primary Examiner* — Yaima Rigol
*Assistant Examiner* — Elias Young Kim
(74) *Attorney, Agent, or Firm* — McClure, Qualey & Rodack, LLP (57) ABSTRACT

Disclosed are a method for managing data and a storage device thereof. The storage device includes at least one memory including a plurality of planes, each plane includes a plurality of blocks, and peer blocks in different planes are belonged to operate in a multi-plane mode. The plurality of blocks are detected to find a unavailable block. Then, available blocks corresponding to the unavailable block in planes other than the plane where the unavailable block is located are marked as backup blocks that do not operate in the multi-plane mode. A first block with effective data is selected from the plurality of blocks operating in the multi-plane mode. Data of the first block is moved to a backup block in the same plane.

18 Claims, 6 Drawing Sheets

| | Plane 0 | Plane 1 | Plane 2 | Plane 3 |
|---|---|---|---|---|
| ← block number | 0 | 1 | 2 | 3 |
| | 4 | 5 | 6 | 7 |
| | 8 | 9 | ~~10~~ | 11 |
| | 12 | 13 | ~~14~~ | 15 |
| | ~~16~~ | 17 | ~~18~~ | 19 |
| | ~~20~~ | 21 | ~~22~~ | 23 |
| | ~~24~~ | ~~25~~ | ~~26~~ | 27 |
| | ~~28~~ | ~~29~~ | ~~30~~ | 31 |
| | ~~32~~ | ~~33~~ | ~~34~~ | 35 |
| | ~~36~~ | ~~37~~ | ~~38~~ | 39 |

(56) References Cited

U.S. PATENT DOCUMENTS

| | | | |
|---|---|---|---|
| 2020/0264789 A1* | 8/2020 | Wen | G06F 3/0647 |
| 2020/0285393 A1* | 9/2020 | Lin | G06F 3/0679 |
| 2023/0069159 A1* | 3/2023 | Huang | G11C 29/4401 |

* cited by examiner

|  | Plane 0 | Plane 1 | Plane 2 | Plane 3 |
|---|---|---|---|---|
| ← block number | 0 | 1 | 2 | 3 |
| | 4 | 5 | 6 | 7 |
| | 8 | 9 | 10 | 11 |
| | 12 | 13 | 14 | 15 |
| | 16 | 17 | 18 | 19 |
| | 20 | 21 | 22 | 23 |
| | 24 | 25 | 26 | 27 |
| | 28 | 29 | 30 | 31 |
| | 32 | 33 | 34 | 35 |
| | 36 | 37 | 38 | 39 |

METHOD FOR MANAGING DATA AND STORAGE DEVICE THEREOF

CROSS REFERENCE TO RELATED APPLICATION

This application claims the priority benefit of Chinese Patent Application Serial Number 202111587443.1, filed on Dec. 23, 2021, the full disclosure of which is incorporated herein by reference.

BACKGROUND

Technical Field

The present disclosure relates to a storage device, and more particularly, to an optimization strategy for memory cell arrays in a multi-plane mode.

Related Art

The flash memory used in storage devices (e.g., solid-state drives) is usually a non-volatile random access storage medium (e.g., NAND flash memory), wherein in the flash memory, the charge is latched by the floating gate to make the charge stored in the floating gate based on the design of the floating gate transistor, so that the flash memory can still retain their stored data even in the absence of a power supply. The NAND flash memory is fabricated from raw silicon materials that are processed into wafers. Hundreds of NAND flash chips can be made from a wafer. The die is a small piece cut from the wafer by a laser. Each die is an independent functional chip, comprising numerous transistor circuits. The multiple dies are finally packaged together to become a flash memory chip.

The capacity structure of the flash memory can be divided into multi-layer architecture from large to small. A flash memory device refers to a single-chip flash memory, which is a packaged product that can be provided externally and usually contains one or more target cells. The target cell is a cell with independent chip selection function, which can be individually addressed and usually comprises one or more logical unit number (LUNs). Each LUN comprises several planes, each plane comprises several blocks, each block comprises several pages, and each page corresponds to a wordline. The LUN is the basic unit that receives and executes flash commands. Different LUNs can receive and execute different commands at the same time. However, in one LUN, only one command can be executed at a time, and it is not possible to write to a certain page and perform read access to other pages at the same time.

Each plane usually has a separate register for pages, and a LUN usually comprises one or two thousand blocks. A block is the smallest unit capable of performing an erasing operation, and usually consists of multiple pages. A page is the smallest unit that can perform programming and reading operations, usually ranging in size from 4 KB/8 KB/16 KB/32 KB.

A cell is the smallest unit, which performs erasing, writing and reading operations in each page, corresponds to a floating gate transistor, can store one or more bits of data, and is the main particle type.

COPYBACK_READ and COPYBACK_PROGRAM are the commands supported in the flash datasheet. The command COPYBACK_READ can be implemented through codes 00H-35H. When the command COPYBACK_READ is run, the flash memory can move the data to the corresponding cache, and then through the code 85H-10H for implement the COPYBACK_PROGRAM, the flash memory moves the data from the cache to other blocks in the same plane.

Briefly speaking, the difference between a single-plane mode and a multi-plane mode is that the number of blocks in one operation is different. In the single-plane mode, only a certain block of a certain plane operates, while in the multi-plane mode, the number of blocks operating simultaneously is defined by the number of planes supported in the flash datasheet. The read and write performance of the multi-plane mode is better than that of the single-plane mode.

However, the copyback operation has the following limitations. First, the copyback operation can only be performed within the same plane, not across different planes or LUNs. Second, the copybacked data cannot be modified. The advantage of the copyback operation is that it only needs to occupy a part of the cache when performing, and does not need to occupy the main control resources of the SSD.

In a traditional production testing process, many poor-quality (or colloquially unavailable) blocks are detected in poor-quality dies and marked as defect blocks. In order to operate smoothly in the multi-plane mode, when one of the blocks is marked as a defect block, even if the blocks corresponding to the defect block in different planes are of good quality and function normally, they are marked as the defect blocks in the defect block table. In this way, the effective space utilization of the storage array decreases.

SUMMARY

In order to solve the above technical problems, the present disclosure provides a method for managing data and a storage device thereof. The present disclosure proposes a method for improving the utilization rate of blocks, which transforms the blocks that cannot be mapped into the multi-plane mode operation into available backup blocks, solves the problem of wasting space caused by directly marking the blocks as defect blocks, and effectively improves the utilization of the blocks, which do not operate in the multi-plane mode. In addition, the present disclosure utilizes the characteristics of the copyback command to achieve the above-mentioned purpose without affecting the operation of the storage device.

The storage device comprises at least one memory comprising a plurality of planes, each plane comprises a plurality of blocks, and peer blocks in different planes are belonged to operate in a multi-plane mode. First, the plurality of blocks are detected to find out a unavailable block. Then, available blocks corresponding to the unavailable block in planes other than the plane where the unavailable block is located are marked as backup blocks that do not operate in the multi-plane mode. Finally, a first block that stores effective data is selected from blocks operating in the multi-plane mode. Data of the first block is moved to a backup block in the same plane.

In an embodiment, access to the backup block is restricted only by a copyback operation.

In an embodiment, after the data of the first block is successfully moved to the backup block, a physical address of the backup block is updated to a mapping table.

In an embodiment, a defect block table is established to record a block number of the unavailable block.

In an embodiment, when the peer blocks in different planes are all available blocks, the peer blocks are operated in a first multi-plane mode, wherein the first multi-plane mode is concatenated by a first number of planes.

In an embodiment, when the number of unavailable blocks in the peer blocks is less than an unavailable threshold, the peer blocks are operated in a second multi-plane mode, wherein a number of planes in the second multi-plane mode is smaller than that in the first multi-plane mode.

In an embodiment, when the number of unavailable blocks in the peer blocks is not less than an unavailable threshold, the peer blocks are marked as the backup blocks.

In an embodiment, the backup blocks do not operate in the first multi-plane mode or the second multi-plane mode.

In an embodiment, a copyback operation is performed after a garbage collection is completed.

In an embodiment, it is determined whether a cache space of a single-level cell (SLC) in the storage device is less than a threshold. If the cache space of SLC is less than the threshold, a copyback operation is performed.

Another embodiment of the present disclosure provides a storage device. The storage device comprises a controller, and a memory. The controller is configured to control an operation of the storage device. The memory is coupled to the controller and is configured to store data under the control of the controller. The memory comprises a plurality of planes, and each plane comprises a plurality of blocks. The controller is configured to execute the method for managing data provided in the previous embodiment of the present disclosure.

In summary, the present disclosure uses the characteristics of the copyback command to propose a method for improving the utilization rate of blocks, which transforms the blocks that cannot be mapped into the multi-plane mode operation into available backup blocks, and solves the problem of wasting space caused by directly marking the blocks as defect blocks, and effectively improves the utilization of the blocks, which do not operate in the multi-plane mode.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to".

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

It must be understood that when a component is described as being "connected" or "coupled" to (or with) another component, it may be directly connected or coupled to other components or through an intermediate component. In contrast, when a component is described as being "directly connected" or "directly coupled" to (or with) another component, there are no intermediate components. In addition, unless specifically stated in the specification, any term in the singular case also comprises the meaning of the plural case.

In the following embodiment, the same reference numerals are used to refer to the same or similar elements throughout the disclosure.

Figure 1:
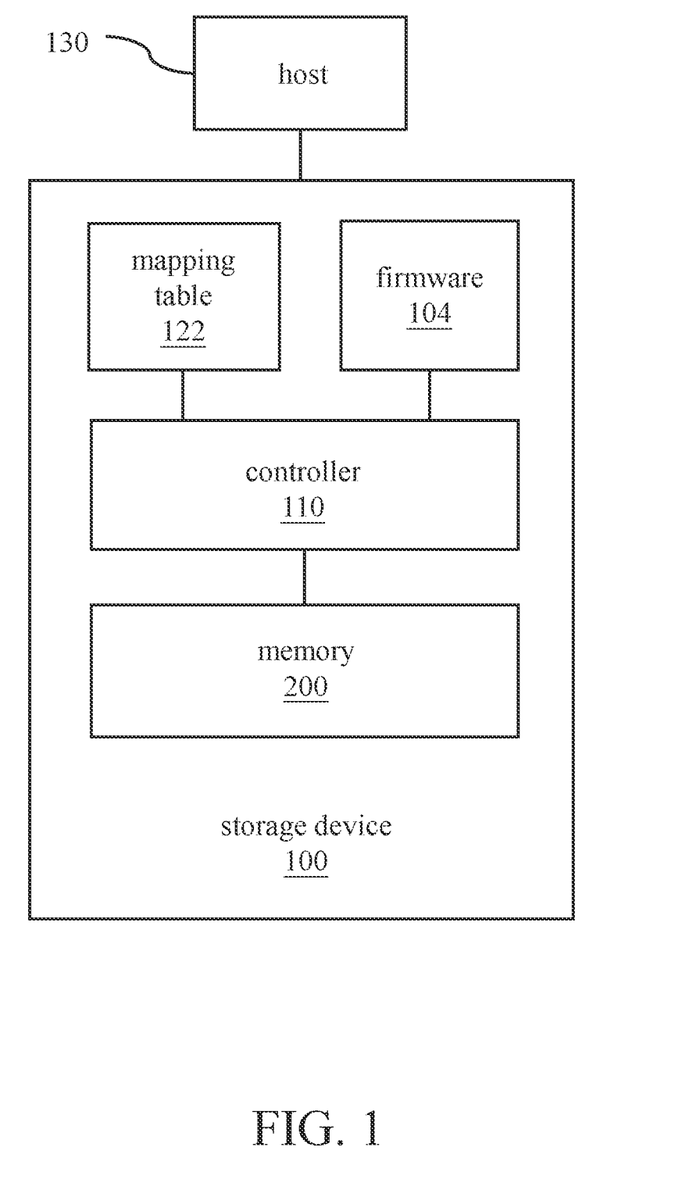
FIG. 1 is an architectural diagram of a storage device according to an embodiment of the present disclosure and a host.

FIG. 1 is an architectural diagram of a storage device according to an embodiment of the present disclosure and a host. An embodiment of the present disclosure provides a storage device 100 that can be connected to a host 130 through a bus, and receive various access requests sent by the host 130 for data access. The storage device 100 comprises one or more memory 200, a controller 110, and firmware 104. The memory 200 may comprise a plurality of blocks, each block comprises a plurality of pages, and each page comprises a plurality of cells, and each cell can be used to store one or more bits of data. The controller 110 is connected to the memory 200 for reading data from the memory 200 or writing data to the memory 200 according to an access request sent by the host 130. The firmware 104 is connected to the controller 110 for enabling the controller 110 to execute a method for managing data.

The controller 110 usually has a flash transition layer (FTL), which is responsible for converting the logical block address (LBA) in the access request of the host 130 into a physical block address (PBA). The operation of address conversion requires the use of a mapping table 122. The mapping table 122 stores the correspondence between logical addresses and physical addresses. The logical address is the location where data is stored for the host 130. The storage device 100 may be a device with various specifications, and the host 130 cannot manage the memory 200 in the storage device 100 substantially, so the access to the data by the host 130 is expressed by a consistent logical address. The physical address where the data is actually stored is converted by the control chip 110 according to the mapping table 122.

Figure 2:
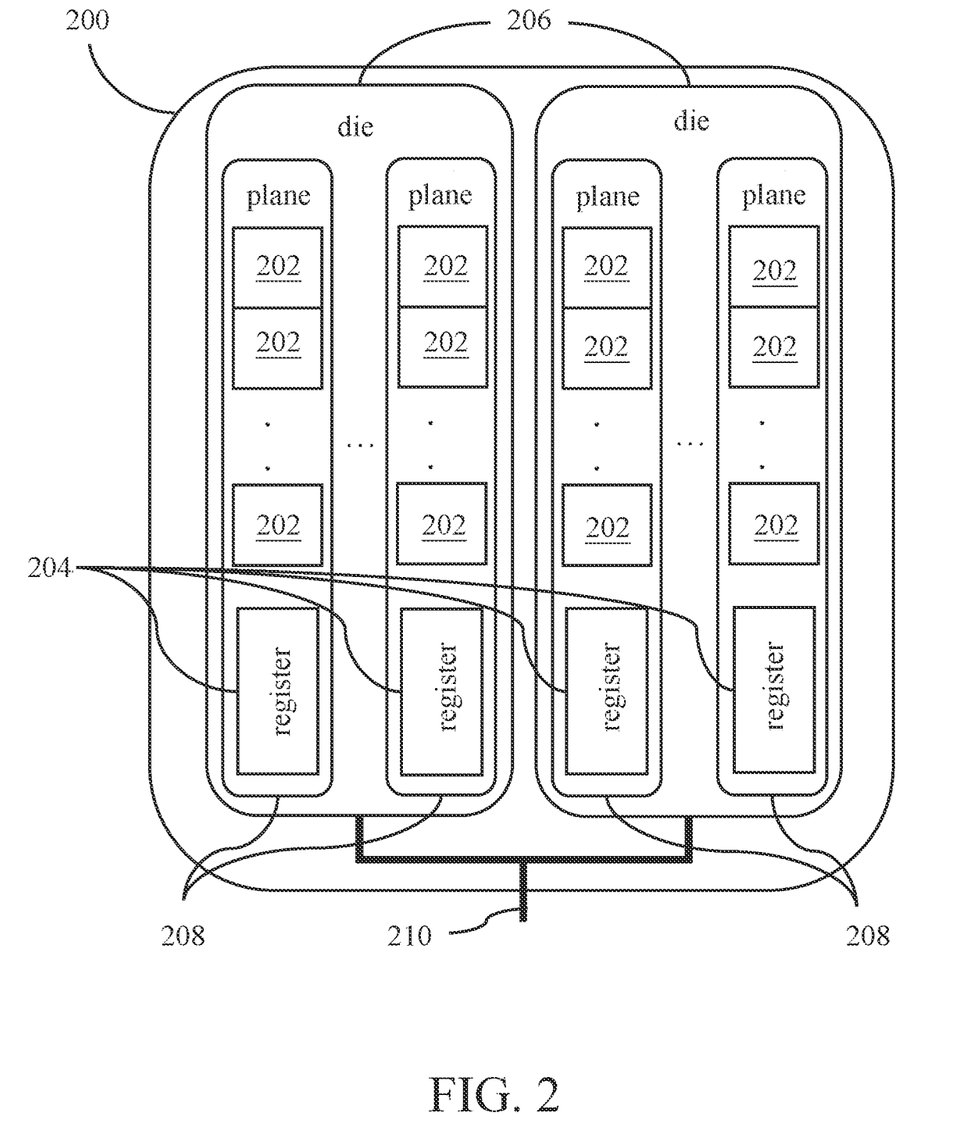
FIG. 2 is an architecture diagram of a memory according to an embodiment of the present disclosure.

FIG. 2 is an architecture diagram of a memory according to an embodiment of the present disclosure. In the memory 200, a plurality of dies 206 are usually arranged, and each die 206 can be divided into a plurality of planes 208. Each plane 208 comprises a plurality of blocks 202. Each block 202 can be divided into a plurality of pages (not shown). Each block 202 has an independent address number, and the location of each page can be found by adding an offset to the address number. Each page comprises a plurality of cells, and each cell is used to store one or more bits of data.

Blocks 202 and pages are units of mapping granularity that are common as data storage in the mapping table. For example, one of the main tasks of the controller 110 is to convert the logical addresses used by the host 130 into physical addresses in the memory 200, and the correspondence is stored in the mapping table 122 described in this embodiment.

Each surface 208 further comprises a register 204, which can store detailed parameter settings related to the planes 208, such as delay parameters, cell levels and other attributes. The cell level can be used to determine the number of bits that each cell can represent, such as a single-level cell (SLC), a multi-level cell (MLC), a triple-level cell (TLC), and a Quad-level cell (QLC). The memory 200 comprises an interface 210 that can be connected to the host 130 through the controller 110.

Figure 3:
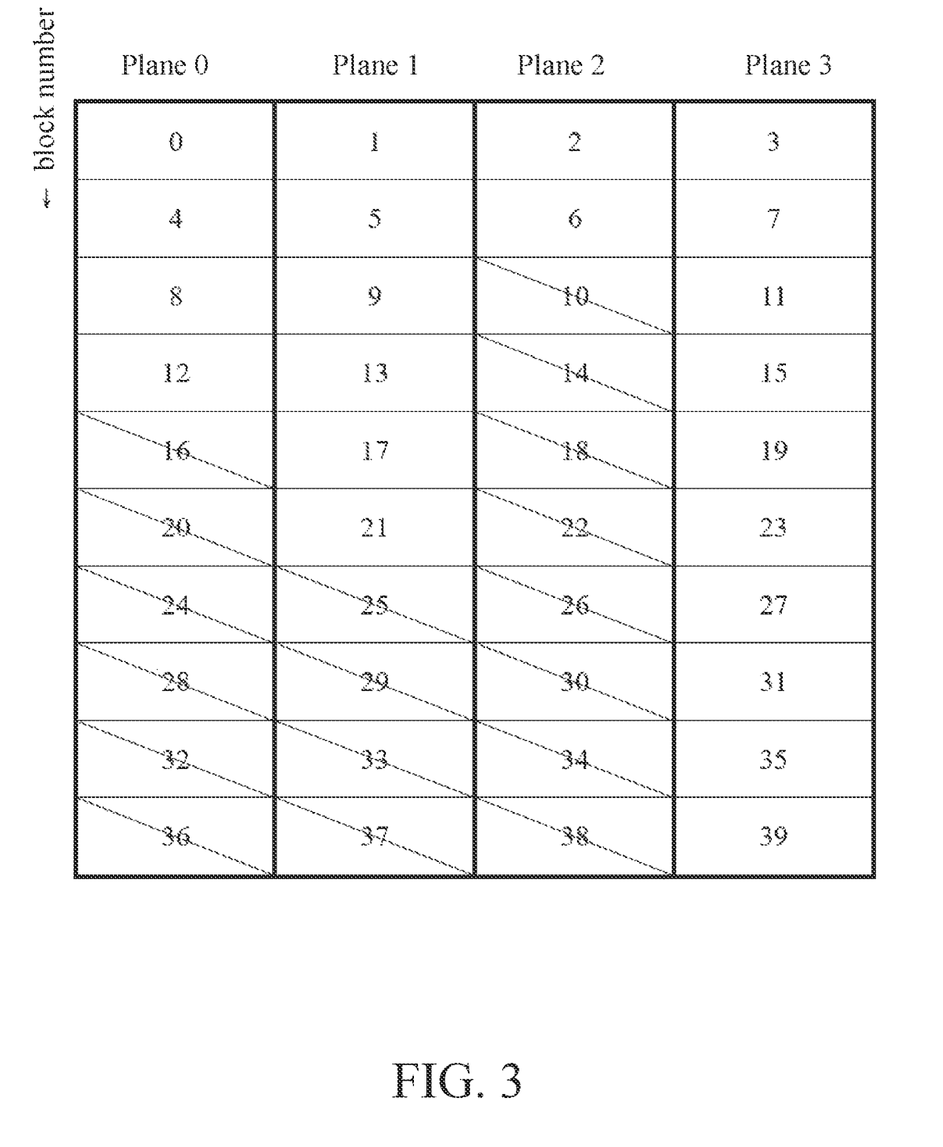
FIG. 3 is a defect block table according to an embodiment of the present disclosure.

FIG. 3 is a defect block table according to an embodiment of the present disclosure. For convenience of description, this embodiment takes four planes and 40 blocks as an example for description. It is understood that the number of planes and the number of blocks are not limited to this in the actual design. As shown in FIG. 3, a die can comprise four planes arranged in a row (plane 0, plane 1, plane 2 and plane 3). The blocks included in each plane are sequentially numbered from 0 to 39. The block numbers with slashes indicate that the blocks are detected as defect blocks, while others are available blocks. Under normal conditions, peer blocks in the plurality of planes can be belonged to operate in a multi-plane model; that is, the peer blocks concatenated are mapped as a logical unit and accessed at the same time, thereby doubling the performance. Taking FIG. 3 as an example, the blocks with block numbers 0, 1, 2, and 3 located in different planes can be concatenated to form a logic unit that operates in the multi-plane mode. Likewise, the blocks with block numbers 4, 5, 6 and 7 located in different planes can also be concatenated as a logic unit operating in the multi-plane mode.

As for block numbers 8, 9, 10 and 11, the block with number 10 is a poor quality or unavailable block and is therefore marked as a defect block. Therefore, the blocks with block numbers 8, 9 and 11 cannot operate in the multi-plane mode. In traditional practice, the blocks with block numbers 8, 9, and 11 are marked as defect blocks together and lose their functionality. The same happens for the blocks with block numbers 12, 13, 14 and 15.

In order to make good use of these blocks which are still available but cannot operate in multi-plane mode, the present disclosure utilizes a moving procedure so that these backup spaces can be fully utilized. For example, the logic of the control chip 110 can be designed to automatically move the low-popularity data to these backup blocks, so that the blocks in the multi-plane mode can be used to store the high-popularity data as much as possible. In a preferred embodiment, the present disclosure uses a copyback command (COPYBACK) to implement the move procedure.

Figure 4:
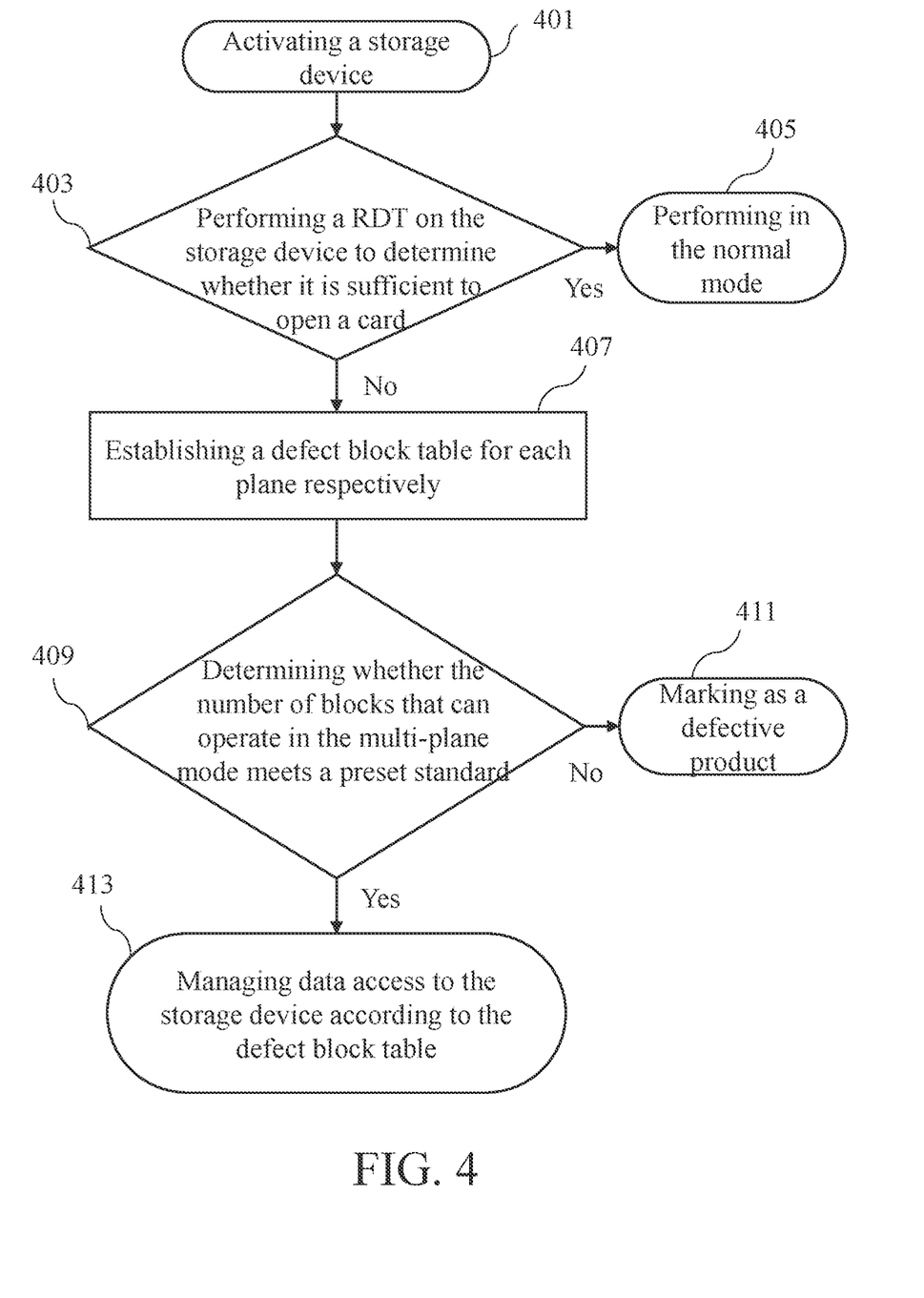
FIG. 4 is a flowchart of production detection according to an embodiment of the present disclosure.

FIG. 4 is a flowchart of production detection according to an embodiment of the present disclosure. In the production process, the memory 200 in the storage device 100 needs to be tested to determine whether it is suitable for delivery. In the step 401, the storage device 100 is activated. In the step 403, a reliability development test (RDT) is performed on the storage device 100 to determine whether it is sufficient to open a card. If the quality of the memory 200 in the storage device 100 is good, for example, the number of defect blocks is lower than a threshold, the step 405 is performed to configure the storage device 100 in the normal mode. The normal mode does not require a defect block table in the storage device 100. Conversely, if the reliability development test is performed to determine that the number of defect blocks in the memory 200 is more than a number (threshold), the step 407 is performed to establish a defect block table for each plane respectively.

Next, in the step 409, according to the defect block table, it is determined whether the number of blocks that can operate in the multi-plane mode meets a preset standard. If the number of blocks that can operate in the multi-plane mode is too few, the product cannot achieve a certain performance after it leaves the factory. Therefore, the step 411 is performed to mark the storage device 100 as a defective product. On the other hand, if the number of blocks which operate in the multi-plane mode is above a certain standard, the step 413 is performed to execute the method for managing data proposed in the present disclosure according to the defect block table.

Figure 5:
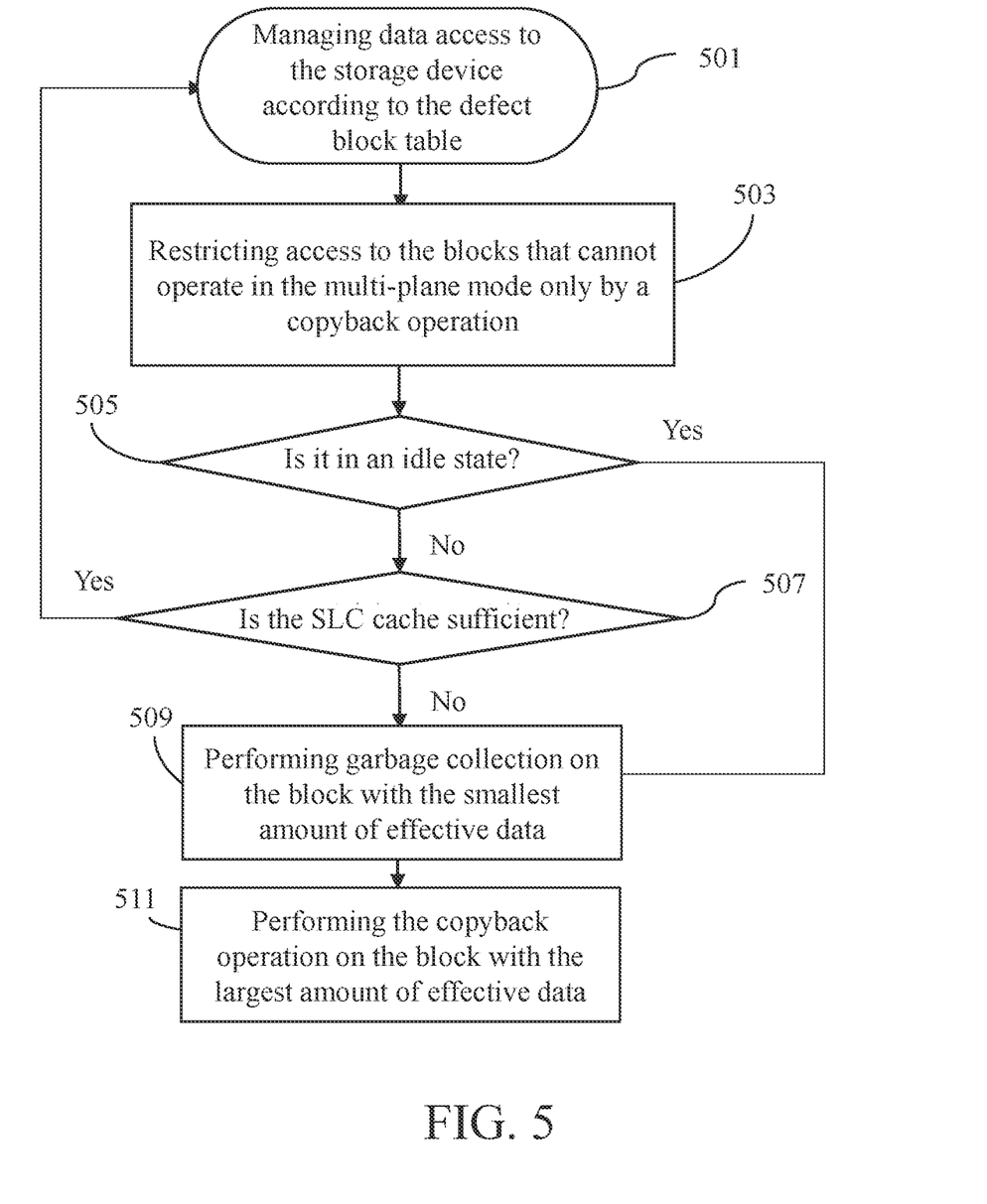
FIG. 5 is a flowchart of the method for managing data according to an embodiment of the present disclosure.

FIG. 5 is a flowchart of the method for managing data according to an embodiment of the present disclosure. In the embodiment of FIG. 4, the method for managing data in the step 413 is described in detail in FIG. 5. In the step 501, the aforementioned method for managing data is enabled in the firmware 104 of the storage device 100, and data access of the storage device 100 is managed according to the defect block table. In the step 503, after the code in the firmware 104 is executed, access to the blocks that cannot operate in the multi-plane mode is restricted only by a copyback operation. For example, the controller 110 may run many conventional control commands, such as garbage collection or other mapping table optimization steps. If the blocks that cannot operate in the multi-plane mode are used to run these commands, the overall performance of the storage device 100 is degraded. In this embodiment, the block marked as a backup block can be limited to be accessed only by the copyback operation, so that the space can be fully utilized.

In the step 505, it is determined whether a specific die or plane in the memory 200 meets the conditions for performing garbage collection, e.g., in an idle state. If a specific die or plane in the memory 200 meets the conditions for performing garbage collection, the step 509 is performed to perform garbage collection on the die or plane, and then the step 511 is performed to perform the copyback operation on the die or plane.

For example, if the storage device 100 is in an idle state, the condition for triggering garbage collection in the controller 110 can also be configured to run a copyback command at the same time to move data of some blocks with the larger amount of effective data to the backup blocks that cannot be mapped into the multi-plane mode operation.

In this embodiment, the garbage collection is usually performed by preferentially selecting a block with less effective data (i.e., the block with a larger remaining storage space). For example, a block that stores the smallest amount of effective data is selected for garbage collection. In another embodiment, the block for garbage collection may be selected using a threshold; for example, the block with the amount of effective data less than the threshold can be selected for garbage collection. Taking FIG. 2 as an example, the blocks with block numbers 0, 1, 2, and 3 may correspond to the amount of effective data amounts stored in 10000, 5000, 2000, and 1000, respectively. In this case, the block with block number 3 is preferentially selected for garbage collection. Since there are known algorithms in the garbage collection procedure, details are not described in this embodiment.

In this embodiment, when the copyback command is executed, a block with larger amount of effective data is preferentially selected for execution. In another embodiment, the block for performing the copyback operation may be selected using a certain threshold; for example, the block with the amount of effective data greater than the certain threshold can be selected for performing the copyback operation. Taking FIG. 2 as an example, the blocks with block numbers 4, 5, 6, and 7 may correspond to the amount of effective data amounts stored in 10000, 5000, 2000, and 1000, respectively. In this case, the block with block number 4 is preferentially selected for performing the copy back operation. When running the copyback command, the backup block of the block with block number 4 can be either the block with block number 8 or the block with block number 12. For example, when the copyback command is run, the data in the block with block number 4 is moved to the block with block number 8, and then the mapping table 122 is modified, so that the host 130 can access the data in the block with block number 8 through the logical address.

On the other hand, even if the storage device 100 is not in the idle state, the step 507 is executed to determine whether the cache space of SLC is sufficient. If the cache space of SLC is insufficient, the garbage collection in step 509 and the copyback command in step 511 can also be triggered. Generally speaking, the cache space of SLC is not an independent external chip, but part of the space, which is divided from the memory 200 in the TLC mode or the QLC mode, is used to simulate the SLC writing (that is, only 1 bit of data is written in each cell), which can effectively improve the performance of the SSD in reading and writing. But this partitioned part of the space is limited. When the capacity of continuous writing reaches the upper limit of the SLC cache space, the reading and writing speed drop back to the original value of the TLC mode. Compared with the dynamic memory cache, the SLC cache is in the TLC memory. If the SLC cache is not specially erased, the data of the SLC cache can be continuously saved and does not disappear due to power failure.

Therefore, the effect of the step 509 and the step 511 is to optimize the data storage in the memory 200, and the step 511 can used to especially make full use of the storage space of the backup blocks, so that the blocks operating in the multi-plane mode can be fully used for data storage or SLC cache.

Figure 6:
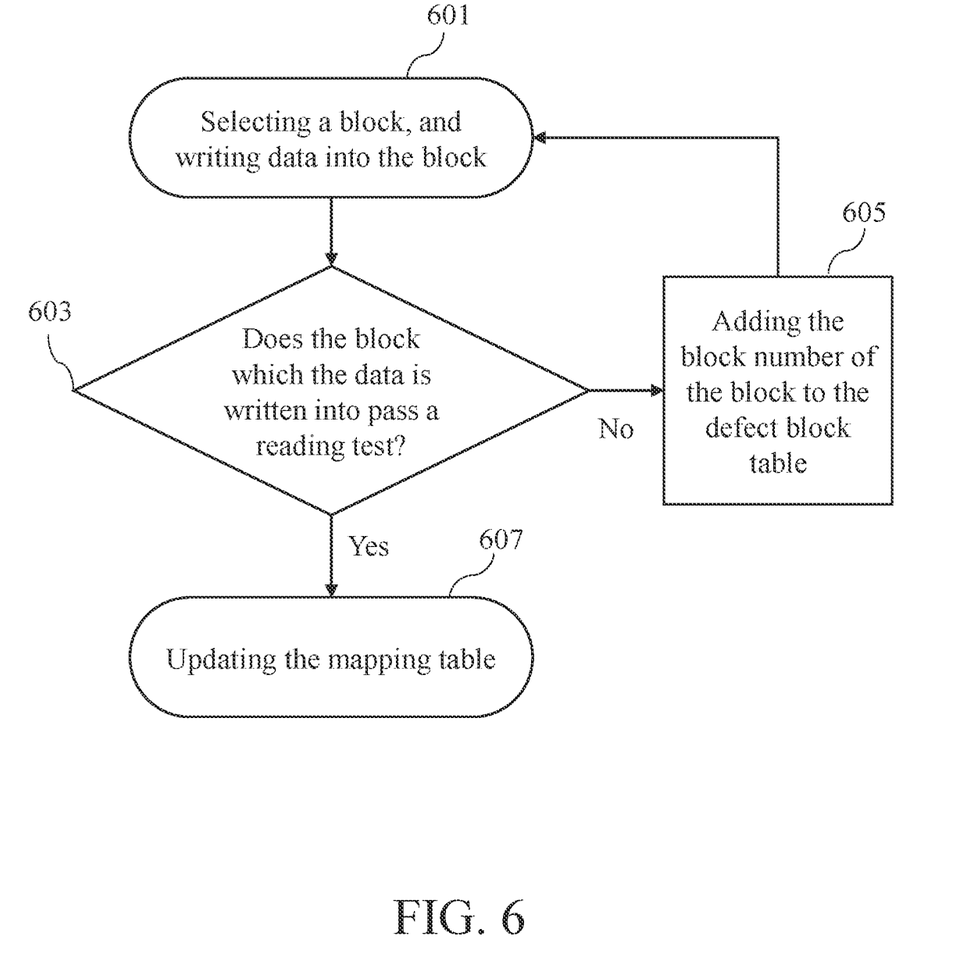
FIG. 6 is a flowchart of updating a mapping table according to an embodiment of the present disclosure.

FIG. 6 is a flowchart of updating a mapping table according to an embodiment of the present disclosure. Since the life of each storage cell in a general solid-state drive is limited, it is necessary to determine whether the written data is correctly stored whenever any block is written with data. In the step 601, data is written into the selected block. In the step 603, a reading test is performed on the written block. If the block fails the reading test, it indicates that the block is corrupted. In the step 605, the block numbers of the blocks that fail the reading test are added to the defect block table. The procedure returns to the step 601 to reselect other blocks for data writing.

After passing the reading test in the step 603, the step 607 is performed to update the mapping table 122 to confirm that the writing is completed. For example, after the copyback operation is performed to complete the data movement, a reading test is performed on the moved data, and a logical-to-physical secondary mapping table is updated, so as to confirm the completion of the data movement.

The detection procedure of FIG. 6 may occur after the garbage collection in the step 509 or the copy back procedure in the step 511, as an example to further confirm that the data is correct. In a further embodiment, for the blocks that cannot be mapped into the multi-plane mode operation, the logical-to-physical secondary mapping table may no longer point to this location, so that garbage collection does not need to deal with blocks with the very large amount of effective data, and the burden is relatively light. In a more specific embodiment, the garbage collection may also be allowed to move data in the backup block to other locations if there is less and less effective data in the backup block.

In summary, the present disclosure implements a unique data access management method by using the copyback command, which can effectively utilize the space of the backup block and improve the use efficiency of the overall storage device 100. In use or at any stage before delivery, the blocks in the memory 200 can be detected in advance to find out a unavailable block. Next, the available blocks corresponding to the unavailable block in other planes other than the plane where the unavailable block is located are marked as backup blocks that cannot be operated in the multi-plane mode. Finally, a first block that stores effective data is selected from the plurality of blocks operating in the multi-plane mode. When a backup block is in the plane where the first block is located, data of the first block is moved to the backup block. After data of the first block is moved to the backup block, a physical address of the backup block may be further updated to the mapping table.

In other words, the present disclosure does not directly discard a single block that cannot be mapped into the multi-plane mode operation, while the previous scheme would mark the single block that cannot be mapped into the multi-plane mode operation as a defect block and discard it. The present disclosure can independently establish a backup block table to manage this part of the information.

After the backup block are detected, in order not to make these backup blocks affect the performance of the storage device 100, the code in the firmware 104 can further set the controller 110 of the storage device 100 to restrict access to the backup blocks only by the copyback operation. The block number of the unavailable block can be recorded by a defect block table established by the controller 110.

In other words, when the storage device 100 processes the data transmitted by the host 130, it does not actively choose to use the backup block for reading and writing, so as to ensure high-speed reading and writing performance. Backup blocks are completely reserved for the copyback command.

In a further embodiment, when the blocks are detected, the peer blocks operate in a first multi-plane mode when the peer blocks in different planes are all available blocks, wherein the first multi-plane mode is concatenated by a first number of planes; the peer blocks operate in a second multi-plane mode when the number of unavailable blocks in the peer blocks is less than an unavailable threshold, wherein the second multi-plane mode is concatenated by a second number of planes, and the second number is smaller than the first number.

In other words, if more than half of the blocks in the storage device 100 cannot be mapped into the multi-plane mode operation, a plane down processing can also be selected. For example, the four-plane mode (that is, the peer blocks of each four planes are concatenated into a unit) is changed to the two-plane mode (that is, the peer blocks of each two planes are concatenated into a unit). As for the blocks in the two-plane mode originally, they can be screened out through the reliability development test. When an error is detected in the block of one of the four planes, two of the remaining three blocks are concatenated to operate in the second multi-plane mode, and the last single block is marked as a backup block.

In another embodiment, when the number of unavailable blocks in the peer blocks exceeds a unavailable threshold, the peer blocks are marked as backup blocks which do not operate in the first multi-plane mode or the second multi-plane mode. For example, there are three corrupted blocks in the peer blocks in the four planes, the remaining block cannot operate in the first multi-plane mode or the second multi-plane mode. In this case, the remaining block can only be marked as a backup block.

When the host 130 writes a large amount of data, the garbage collection is enabled to select the block with the smallest amount of effective data to move the data, and at the same time, the copyback command is also run to find the block with the largest amount of effective data in other planes of the same die, and run the commands such as COPYBACK_READ or COPYBACK_PROGRAM to move effective data. The largest amount of effective data is a relative value, which can be dynamically adjusted by the firmware 104. For example, it can be set that the moving condition is met when the expected effective data capacity of a block exceeds 85%. In an ideal situation, assuming that the logical block numbers written by the host 139 are not repeated, garbage collection may not even be performed, and the data is all moved by the copyback operation. This situation can significantly improve the performance of certain read and write operations, such as the access test software HDTune.

The solution proposed in the present disclosure mainly aims to improve the space utilization of blocks that cannot be mapped into the multi-plane mode operation, and at the same time, it does not reduce the read and write performance of the solid-state drive. In addition, the usage strategy of the copyback command is mainly that the firmware 104 selects a block with relatively large amount of effective data to move data, so as to make good use of the space of the backup block. The storage granularity of the backup block can be adjusted through the register 204, for example, from SLC to TLC or QLC, so as to further improve space utilization. In this way, two to three available blocks can be released stably each time the copyback procedure is performed. The data moved by the copyback command is in units of blocks, so the more effective data in the blocks, the better the efficiency. Since the copyback operation does not need to consume the internal resources of the controller 110 and only needs to occupy a small amount of flash memory cache when performing, the bottom speed is found to be significantly improved when performing the kind of test that is a sequential test and does not rewrite logical block numbers, such as H2Test or HDtune.

In summary, the present disclosure uses the characteristics of the copyback command to propose a method for improving the utilization rate of blocks, which transforms the blocks that cannot be mapped into the multi-plane mode operation into available backup blocks, and solves the problem of wasting space caused by directly marking the blocks as defect blocks, and effectively improves the utilization of the blocks, which do not operate in the multi-plane mode.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A method for managing data stored in a storage device, the storage device comprising at least one memory comprising a plurality of planes, each plane comprising a plurality of blocks, wherein peer blocks in different planes are configured to operate in a multi-plane mode and mapped together as a logical unit, the method comprising:
   finding out an unavailable block from a defect block table;
   marking as backup blocks available peer blocks concatenated in a same logical unit to the unavailable block in planes other than the plane where the unavailable block is located, so that those blocks do not operate in the multi-plane mode;
   restricting access to the backup blocks such that those blocks can only be accessed via a copyback operation;
   selecting a first block that stores effective data from blocks operating in the multi-plane mode; and
   moving data of the first block to a backup block in the same plane by using a copyback operation.

2. The method according to claim 1, further comprising:
   updating a physical address of the backup block to a mapping table after the data of the first block is successfully moved to the backup block.

3. The method according to claim 1, further comprising:
   establishing the defect block table to record a block number of the unavailable block.

4. The method according to claim 1, further comprising:
   in response to the peer blocks in different planes all being available blocks, the peer blocks are operated in a first multi-plane mode, wherein the first multi-plane mode is concatenated by a first number of planes.

5. The method according to claim 4, further comprising:
   in response to the number of unavailable blocks in the peer blocks being less than a predetermined threshold amount, the peer blocks are operated in a second multi-plane mode, wherein a number of planes in the second multi-plane mode is smaller than that in the first multi-plane mode.

6. The method according to claim 5, wherein the backup blocks do not operate in the first multi-plane mode or the second multi-plane mode.

7. The method according to claim 1, further comprising:
in response to the number of unavailable blocks in the peer blocks not being less than a predetermined threshold amount, the peer blocks are marked as the backup blocks.

8. The method according to claim 1, wherein the step of moving data of the first block to the backup block in the same plane is performed after a garbage collection operation is completed.

9. The method according to claim 1, further comprising:
determining whether a cache space of a single-level cell in the storage device is less than a threshold; and
performing a copyback operation in response to the cache space of the single-level cell being less than the threshold amount.

10. A storage device having at least one memory comprising a plurality of planes, each plane comprising a plurality of blocks, wherein peer blocks in different planes are configured to operate in a multi-plane mode and mapped together as a logical unit, the storage device comprising:
a controller, configured to control an operation of the storage device; and
the at least one memory, coupled to the controller, is configured to store data under the control of the controller;
wherein the controller is configured to:
find out an unavailable block from a defect block table;
mark as backup blocks available peer blocks concatenated in a same logical unit to the unavailable block in planes other than the plane where the unavailable block is located, so that those blocks do not operate in the multi-plane mode;
restrict access to the backup blocks such that those blocks can only be accessed via a copyback operation;
select a first block that stores effective data from blocks operating in the multi-plane mode; and
move data of the first block to a backup block in the same plane by using a copyback operation.

11. The storage device of claim 10, wherein the controller is configured to:
update a physical address of the backup block to a mapping table after the data of the first block is successfully moved to the backup block.

12. The storage device of claim 10, wherein when the peer blocks in different planes are all available blocks, the peer blocks are operated in a first multi-plane mode.

13. The storage device of claim 12, wherein when the number of unavailable blocks in the peer blocks is less than a predetermined threshold amount, the peer blocks are operated in a second multi-plane mode; wherein a number of planes in the second multi-plane mode is smaller than that in the first multi-plane mode.

14. The storage device of claim 13, wherein the backup blocks do not operate in the first multi-plane mode or the second multi-plane mode.

15. The storage device of claim 10, wherein when the number of unavailable blocks in the peer blocks is not less than a predetermined threshold amount, the peer blocks are marked as the backup blocks.

16. The storage device of claim 10, wherein the controller is configured to:
perform a copyback operation after a garbage collection operation is completed.

17. The storage device of claim 10, wherein the controller is configured to:
perform a copyback operation in response to a cache space of a single-level cell in the storage device being less than a threshold amount.

18. The storage device of claim 10, wherein the controller is configured to:
establish the defect block table to record a block number of the unavailable block.

* * * * *